US012764860B2

(12) United States Patent
Liu et al.

(10) Patent No.: US 12,764,860 B2
(45) Date of Patent: Oct. 13, 2026

(54) ELECTRONIC DEVICE

(71) Applicant: InnoLux Corporation, Miao-Li County (TW)

(72) Inventors: Yu-Ting Liu, Miao-Li County (TW); Yeong-E Chen, Miao-Li County (TW); Chean Kee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 143 days.

(21) Appl. No.: 18/787,397

(22) Filed: Jul. 29, 2024

(65) Prior Publication Data

US 2024/0389229 A1 Nov. 21, 2024

Related U.S. Application Data

(63) Continuation of application No. 17/851,246, filed on Jun. 28, 2022, now Pat. No. 12,075,566, which is a continuation of application No. 16/884,323, filed on May 27, 2020, now Pat. No. 11,406,015.

(30) Foreign Application Priority Data

Jun. 14, 2019 (CN) ......................... 201910517064.1

(51) Int. Cl.
*H05K 1/11* (2006.01)
*H05K 1/02* (2006.01)
*H05K 1/18* (2006.01)

(52) U.S. Cl.
CPC ............. *H05K 1/113* (2013.01); *H05K 1/028* (2013.01); *H05K 1/11* (2013.01); *H05K 1/18* (2013.01); *H05K 2201/0338* (2013.01); *H05K 2201/10128* (2013.01)

(58) Field of Classification Search
CPC .......... H05K 1/113; H05K 1/028; H05K 1/11; H05K 1/18; H05K 2201/0338; H05K 2201/10128; H05K 2201/09236; H05K 2201/09672; G02F 1/13458; H10W 72/019; H10W 72/923; H10W 72/932
See application file for complete search history.

(56) References Cited

U.S. PATENT DOCUMENTS

2019/0296148 A1* 9/2019 Tanaka ................. H10D 30/668

* cited by examiner

*Primary Examiner* — Timothy J Thompson
*Assistant Examiner* — Aditya Sharma
(74) *Attorney, Agent, or Firm* — McClure, Qualey & Rodack, LLP

(57) ABSTRACT

An electronic device includes a substrate, a first conductive structure, a second conductive structure, a first wire, and a second wire. The substrate includes a peripheral region. The first conductive structure is in the peripheral region and includes a first conductive layer and a second conductive layer. The first and the second conductive layer are arranged along a first direction. The second conductive structure is in the peripheral region and includes a third conductive layer. The first and the second conductive structure are arranged along a second direction, which is perpendicular to the first direction. The first wire is in the peripheral region and is electrically connected between the first and the third conductive layer. The second wire is in the peripheral region and is electrically connected to the second conductive layer. The first wire is adjacent to the second wire along the first direction.

9 Claims, 10 Drawing Sheets

ELECTRONIC DEVICE

CROSS REFERENCE TO RELATED APPLICATIONS

This Application is a Continuation of pending U.S. patent application Ser. No. 17/851,246, filed Jun. 28, 2022 (now U.S. Pat. No. 12,075,566), which is a Continuation of U.S. Pat. No. 11,406,015, filed May 27, 2020, and entitled "BONDING PAD STRUCTURE" (now U.S. Pat. No. 11,406,015), which claims priority of China Patent Application No. 201910517064.1, filed on Jun. 14, 2019, the entirety of which is incorporated by reference herein.

TECHNICAL FIELD

Field of the Invention

The present disclosure relates to a bonding pad structure for an electronic device.

BACKGROUND

Description of the Related Art

Various electronic devices, such as smartphones, tablets, laptops, displays and TVs, have recently become indispensable necessities of life in modern society. With the rapid development of electronic products, consumers have higher expectations for the quality and functionality of these products. For example, it is hoped that electronic products can be more convenient, portable, and take better images.

In order to achieve the foregoing objectives, various elements and/or wire connecting the elements and pitches on a substrate must be reduced further. However, designers face many additional challenges when trying to scale down the various elements. For example, when the bonding pads on a substrate that is used to connect or transfer other wires are too close, electron transfer may occur between adjacent metal layers, causing errors in the transmitted signal.

Therefore, although existing bonding pads have generally met requirements, they are not satisfactory in all respects, so there is still a need for improvement of the bonding pads.

SUMMARY

Some embodiments of the present disclosure provide an electronic device, including: a substrate, a first conductive structure, a second conductive structure, a first wire, and a second wire. The substrate includes a peripheral region. The first conductive structure is in the peripheral region and includes a first conductive layer and a second conductive layer. The first and the second conductive layer are arranged along a first direction. The second conductive structure is in the peripheral region and includes a third conductive layer. The first and the second conductive structure are arranged along a second direction, which is perpendicular to the first direction. The first wire is in the peripheral region and is electrically connected between the first and the third conductive layer. The second wire is in the peripheral region and is electrically connected to the second conductive layer. The first wire is adjacent to the second wire along the first direction.

In order to make the above and other objects, features, and advantages of the present disclosure more comprehensible, some embodiments are listed below and described in detail with the accompanying drawings as follows.

BRIEF DESCRIPTION OF THE DRAWINGS

The various aspects of the present disclosure could be fully understood from the following detailed description and the accompanying drawings. It should be noted that, in accordance with standard practice in the industry, various features are not drawn to scale and are for illustration only. In fact, it is possible to arbitrarily enlarge or reduce the size of the element to more clearly illustrate the features of the present disclosure.

DETAILED DESCRIPTION

Figure 1:
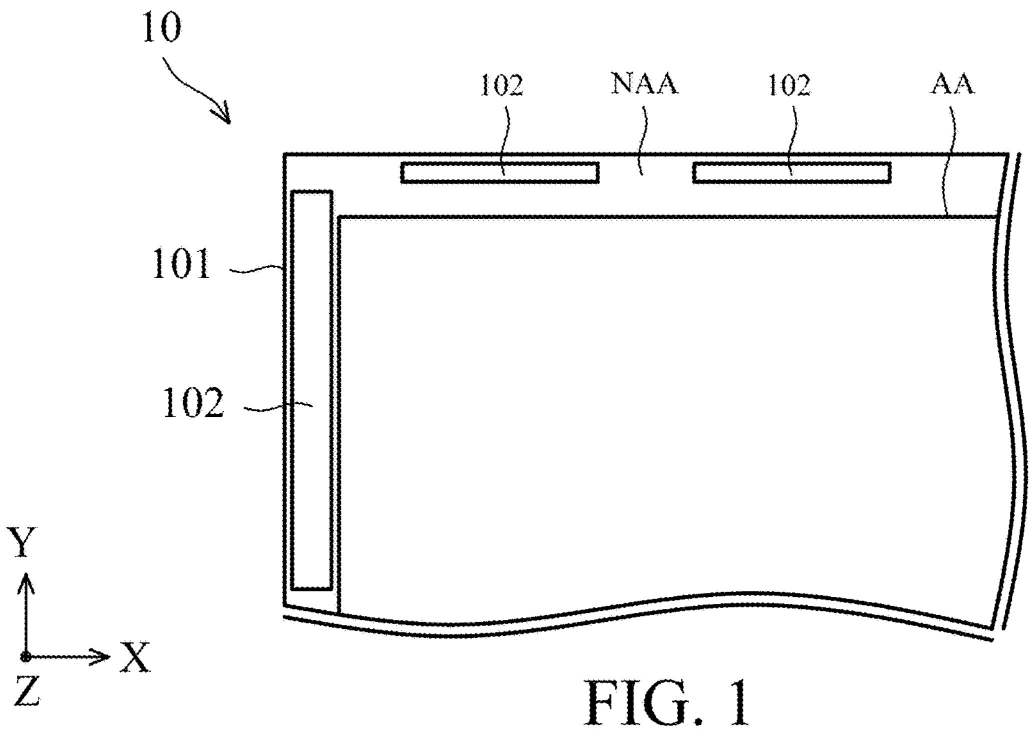
FIG. 1 is a schematic partial top view of the position of the bonding pad disposing region, according to some embodiments of the present disclosure.

The bonding pad structure provided by the present disclosure will be described in detail in the following description. It should be understood that, in the following description, various embodiments and examples are provided in order to implement the different aspects of some embodiments of the present disclosure. The specific elements and arrangements described in the following description are set forth in order to describe some embodiments of the present disclosure in a clear and easy manner. Of course, these are only used as examples but not as limitations of the present disclosure. In addition, like and/or corresponding numerals may be used in different embodiments to denote like and/or corresponding elements in order to clearly describe the present disclosure. However, the use of like and/or corresponding numerals are merely for the purpose of simplicity and clarity of the description of some embodiments of the present disclosure, and are not intended to suggest any correlation between different embodiments and/or structures discussed.

It will be understood that when an element or layer is referred to as being "disposed on" another dement or layer, it may directly on the other element or layer, or intervening elements or layers may be present. In contrast, when an element is referred to as being "directly on" to" another element or layer, there are no intervening elements or layers present.

It will be understood that the elements or devices in the drawings may be present in any form known to those with ordinary skill in the art. In addition, relative terms such as "under", "lower" or "bottom" or "above", "higher" or "top" may be used in the embodiments to describe the relative relationship of one element of the drawing to another. It may be understood that if the device in the drawing is flipped upside down, the element described on the "lower" side will become the element on the "higher" side. The embodiments of the present disclosure can be understood in conjunction with the drawings, and the drawings of the present disclosure are also considered as part of the disclosure. It should be understood that the drawings of the present disclosure are not drawn to scale. In fact, the size of the elements may be arbitrarily enlarged or reduced in order to clearly present the features of the present disclosure.

Furthermore, the elements or devices in the drawings of the present disclosure may be present in various forms known to those with ordinary skill in the art. In addition, it should be understood that, although the terms "first", "second" etc. are used herein to describe various elements, components, or parts, these elements, components, or parts should not be limited by these terms. These terms are only used to distinguish one elements, components, regions, layers, or parts from other elements, components, regions, layers, or parts. Thus, a first element, component, region, layer, or part discussed below could be termed as a second element, component, region, layer, or part without departing from the teachings of the present disclosure.

Here, the terms "about", "approximately", "substantially" usually means within 20%, better within 10%, more better within 5%, 3%, 2%, 1% or 0.5% of a given value or range. Here, the given value is an approximate number. That is, in the absence of a specific description of "about", "approximately", "substantially", the meaning of "about", "approximately", "substantially" may still be implied.

In some embodiments of the present disclosure, the terms for connection or conjugation, such as "connect", 'interconnect' etc. indicate that the two structures may be directly in contact with each other or be indirectly in contact with each other with other structure disposed therebetween as well, unless the context clearly indicates otherwise. It may be understood that the term "cover over . . . " or similar terms in the present disclosure may be directly in contact with the covered object, or can also be above the covered object, such that the projection of the covering object partially overlaps the projection of the covered object, but not directly in contact with the covered object.

As wiring precision requirements of the electronic device (such as display device) gradually increase, the pitches between the wires and the bonding pads for loading, connecting wires, and/or other devices in the electronic device must be further reduced in size. However, when the bonding pads are too close, the transmission electrons in the bonding pads may be transferred between the bonding pads of the same signal source, which will cause the transmission signal to change and cause errors, which greatly reduces the reliability of the electronic device.

The present disclosure provides a bonding pad structure. By using a stereometric space above the bonding pad, distances between adjacent conductive layers and the substrate they located on are different. Therefore, even if the bonding pads are arranged closer in the arrangement direction, there is still a separation distance between the conductive layers, so that the electron transfer effect can be greatly reduced.

Referring to FIG. 1, the described bonding pad structure of the present disclosure can be applied to any electronic device with wire connection requirements, such as communication devices or display devices etc. For example, as shown in FIG. 1, FIG. 1 is a schematic partial top view of a display device 10, according to some embodiments of the present disclosure (i.e. viewing a substrate 101 from the normal direction (direction Z) of the substrate 101. Direction Y and direction X are perpendicular to direction Z respectively, direction Y and direction X are also perpendicular to each other, and direction X is substantially parallel to one side of the substrate). In some embodiments, the display device 10 may be a liquid crystal display panel including the substrate 101. The substrate may be of rectangular, polygon or any other suitable shape, but not limited thereto. The substrate 101 may include a display region AA and a non-display region NAA, the display region AA may be rectangular, polygonal or any other suitable shape, but not limited thereto; the non-display region NAA may be used to dispose electronic wires and/or other electronic elements, such as bonding pads, pixel drive elements, electro static discharge protecting elements or Gate on Panel (GOP) circuit design therein. In some embodiments, the bonding pad can be electrically connected to the GOP circuit, but not limited thereto. In some embodiments, as shown in FIG. 1, there are a plurality of bonding pad disposing regions 102 in the non-display region NAA of the substrate 101, and a plurality of bonding pads (not shown in FIG. 1) may be disposed in the bonding pad disposing region 102. The bonding pad disposing region 102 may be any other suitable shape or size, such as the bonding pad disposing region 102 shown in the left of FIG. 1.

Figure 2:
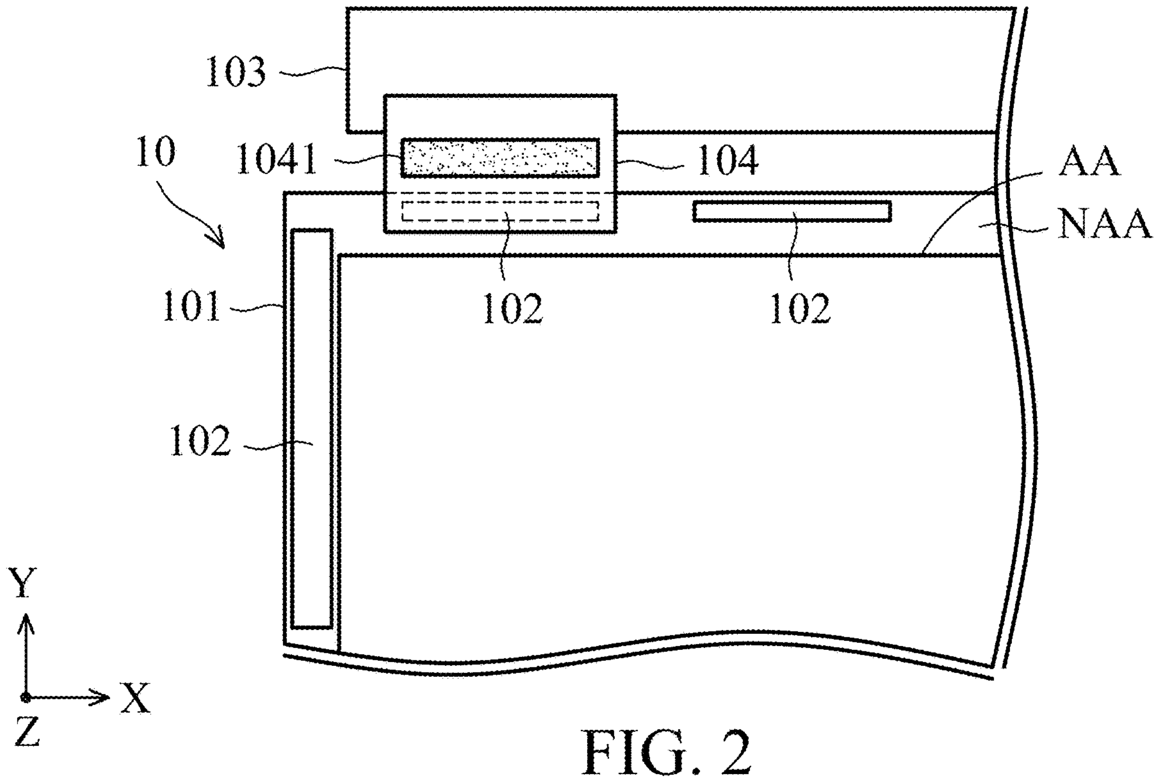
FIG. 2 is a schematic usage diagram of the bonding pad disposing region, according to some embodiments of the present disclosure.

In some embodiments, the circuit wires or elements on the substrate 101 of the display device 10 can be electrically connected to an external driving circuit via the bonding pads in the bonding pad disposing region 102 to transmit related control signals from the outside to each pixel in the display region AA on the substrate. For example, referring to FIG. 2, it is a schematic usage diagram of the bonding pad disposing region, according to some embodiments of the present disclosure. As shown in FIG. 2, the display device 10 may include a driving circuit 103, the driving circuit 103 may, for example, be disposed on a printed circuit board (PCB). A circuit connecting element 104 may be electrically connected to the bonding pads in the bonding pad disposing region 102 and the driving circuit 103 respectively. The circuit on the substrate 101 can be electrically connected to the driving circuit 103 by the circuit connecting element 104, due to the electrically connection of part of the circuit (e.g. data lines or scan lines) on the substrate 101 with the bonding pads in the bonding pad disposing region 102. In some embodiments, the circuit connecting element 104 may be a tape carrier package on which a drive chip 1041 is disposed.

Figure 3:
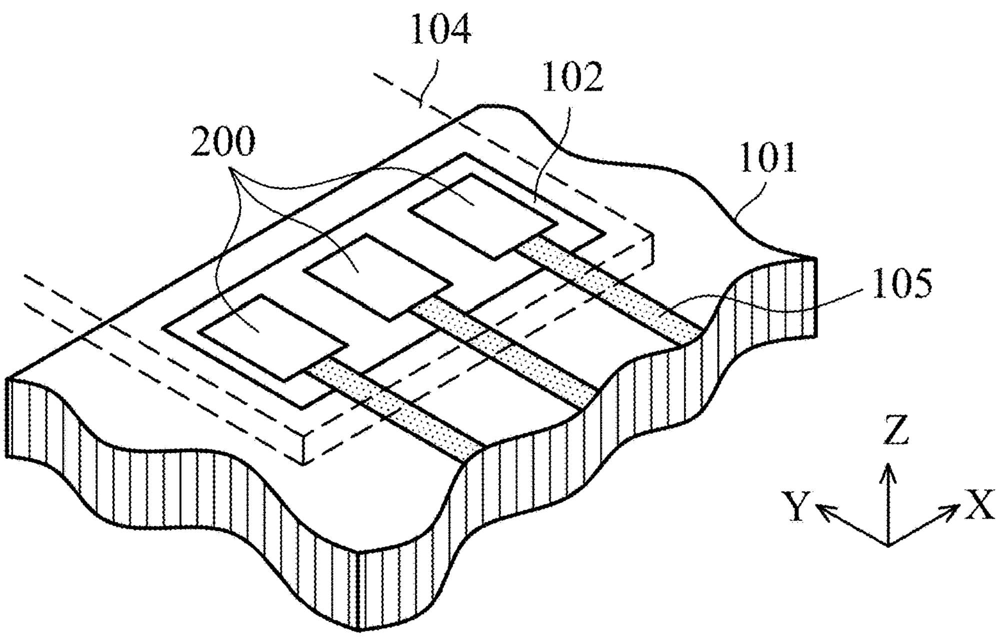
FIG. 3 is a schematic configuration diagram of the bonding pads in the bonding pad disposing region, according to some embodiments of the present disclosure.

Referring to FIG. 3, it is a schematic configuration diagram of the bonding pads 200 in the bonding pad disposing region 102, according to some embodiments of the present disclosure. As mentioned above, the substrate 101 may include the bonding pad disposing region 102 thereon, and a plurality of the bonding pads 200 may be disposed in the bonding pad disposing region 102. The bonding pad 200 may be rectangular or any other suitable shape. In some embodiments, bonding pads 200 are rectangular and are arranged side by side substantially parallel to each other. In some embodiments, the extending direction of arrangement of the bonding pads 200 (along direction X in FIG. 3), is substantially parallel to one side of the substrate 101. As mentioned above, because the circuit connecting element 104 may be electrically connected to the bonding pads 200, and the bonding pads 200 may be electrically connected to wires 105 on the substrate 101, the circuit connecting element 104 may be electrically connected to the wires 105 on the substrate 101.

Although a tape carrier package (TCP) technology described here as an example, those skilled in the art will understand that the bonding pad structure described in the present disclosure may also be applied to other electrical bonding-related technologies, such as chip-on-glass (COG), chip-on-film (COF), or flexible printed circuit (FPC).

The substrate 101 described in the present disclosure can be made of any suitable material; it can be a rigid or flexible substrate; and it can be a single layer or a combination of multiple layers. For example, the materials of the substrate 101 of the display device 10 may include glass, sapphire glass, polyimide (PI), polyethylene terephthalate (PET), polymethyl methacrylate (PMMA), or a combination thereof, but they are not limited thereto.

Figure 4A:
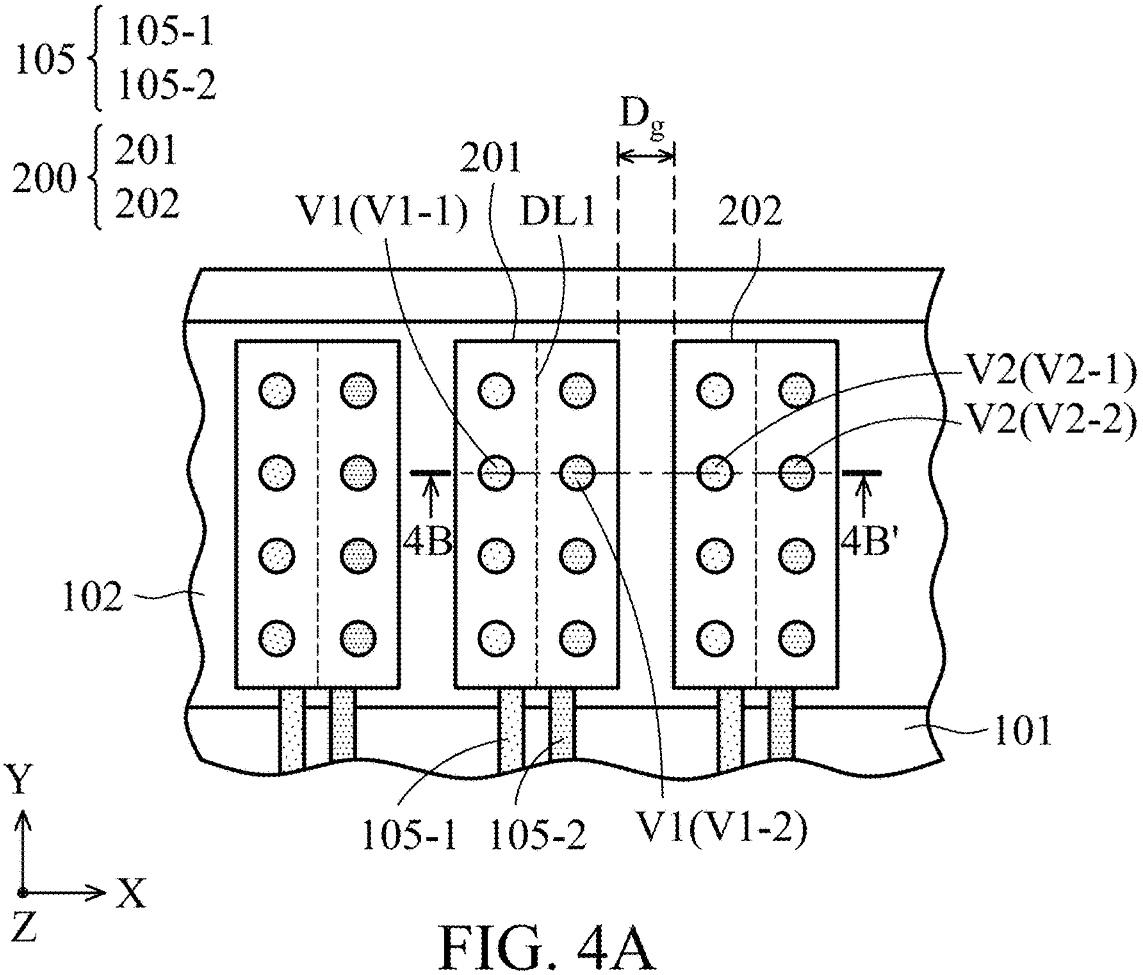
FIG. 4A is a schematic top view of the bonding pad structure, according to some embodiments of the present disclosure.
Figure 4B:
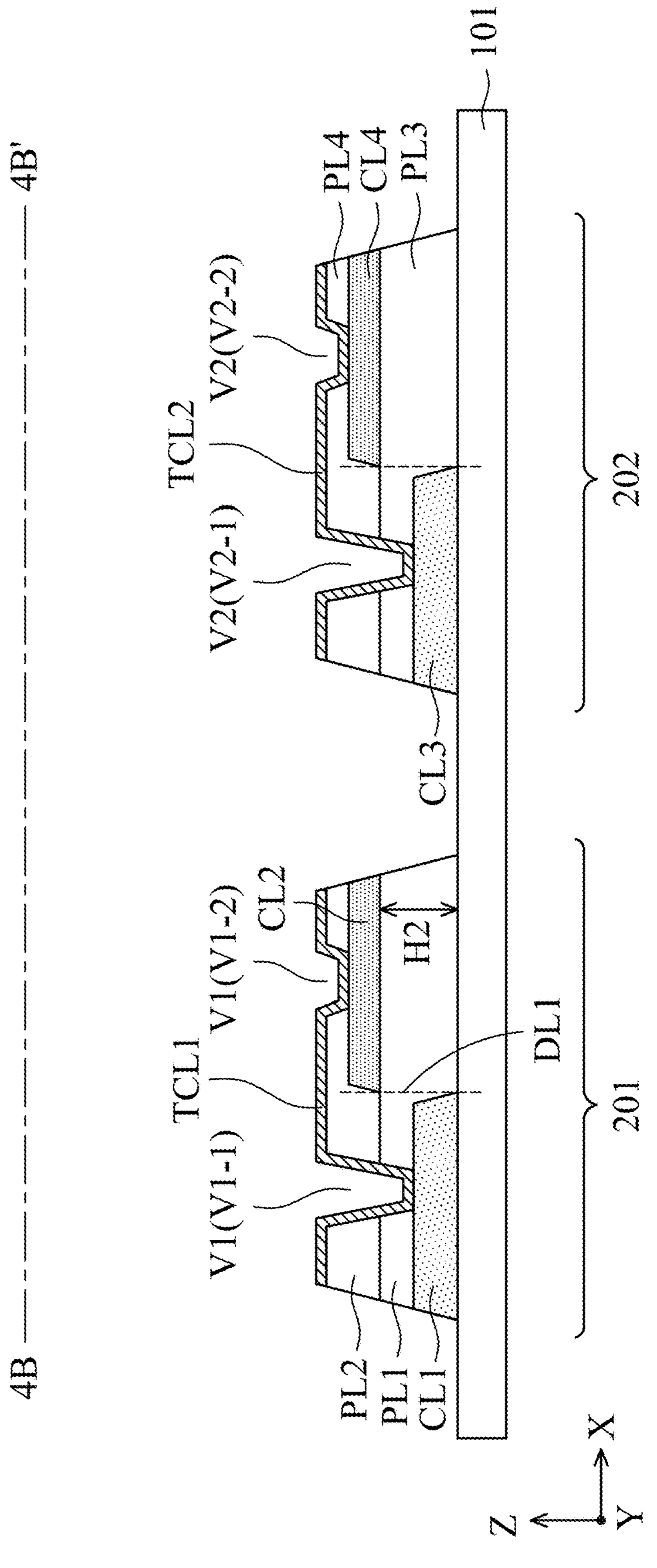
FIG. 4B is a schematic cross-sectional view taken along line 4B-4B' in FIG. 4A according to some embodiments of the present disclosure.

Referring to FIGS. 4A and 4B, FIG. 4A is a schematic top view (viewing the substrate 101 from the normal direction) of the bonding pad structure, according to some embodiments of the present disclosure. FIG. 4B is a schematic cross-sectional view taken along line 4B-4B' in FIG. 4A according to some embodiments of the present disclosure. In some embodiments, a plurality of the bonding pads 200 are arranged side by side substantially parallel to each other along a direction (direction X in FIG. 3) in the bonding pad disposing region 102, said arrangement direction is substantially parallel to a side of the substrate 101. The bonding pads 200 may include a first bonding pad 201 and a second bonding pad 202. In some embodiments, the first bonding pad 201 and the second bonding pad 202 are adjacent (i.e. there are no other bonding pads between the first bonding pad 201 and the second bonding pad 202), and there is no direct connection or contact therebetween.

To understand the present disclosure more clearly, referring to FIG. 4B, it shows the internal structure of the bonding pad 200. In some embodiments, the first bonding pad 201 includes a first conductive layer CL1 disposed on, and in direct contact with, the substrate 101, a first passivation layer PL1 disposed on the substrate 101 and the first conductive layer CL1, a second conductive layer CL2 disposed on the first passivation layer PL1, and a second passivation layer PL2 disposed on the first passivation layer PL1 and the second conductive layer CL2. In some embodiments, the first passivation layer PL1 and the second passivation layer PL2 may include the same materials or elements. In some embodiments, when viewing the substrate 101 from the normal direction, the first conductive layer CL1 is adjacent to the second conductive layer CL2. That is, in the X direction, there are no other first conductive layer CL1 or second conductive layer CL2 interposed between the first conductive layer CL1 and the second conductive layer CL2. In addition, an orthographic projection of the first conductive layer CL1 on the substrate and an orthographic projection of the second conductive layer CL2 on the substrate may partially overlap, or may not overlap.

In some embodiments, the first bonding pad 201 further include a plurality of first via holes V1. Some of the first via holes V1 (e.g. the first via holes V1-1 in FIG. 4A) expose the first conductive layer CL1, and other first via holes V1 (e.g. the first via holes V1-2 in FIG. 4A) expose the second conductive layer CL2. That is, a portion of the first via holes V1 (e.g. the first via holes V1-1 in FIG. 4A) pass through the second passivation layer PL2 and the first passivation layer PL1 to expose the first conductive layer CL1; and another portion of the first via holes V1 (the first via holes V1-2 in FIG. 4A) pass through the second passivation layer PL2 but not the first passivation layer PL1 to expose the second conductive layer CL2. The term "expose" described in the present disclosure is with respect to the layer where the via holes are located. Therefore, in some embodiments, the object exposed by the via holes can still be covered with other layers thereon. In addition, in some embodiments, the expression "the via hole exposes . . . conductive layer" set forth in the present disclosure indicates that the entirety of the bottom of said via hole may be said metal layer, or only some parts of the bottom of said via hole may include said metal layer.

In some embodiments, if there is a need to electrically connect the first conductive layer CL1 with the second conductive layer CL2, the first bonding pad 201 may further include a first connecting conductive layer TCL1 disposed on the second passivation layer PL2 and in the first via holes V1. That is, the first connecting conductive layer TCL1 is electrically connected to the first conductive layer CL1 and the second conductive layer CL2 through the first via holes V1.

As shown in FIG. 4B, in some embodiments, the structure of the second bonding pad 202 is similar to that of the first bonding pad 201. The second bonding pad 202 also includes a third conductive layer CL3 disposed on, and in direct contact with, the substrate 101, a third passivation layer PL3 disposed on the substrate 101 and the third conductive layer CL3, a fourth conductive layer CL4 disposed on the third passivation layer PL3, and a fourth passivation layer PL4 disposed on the third passivation layer PL3 and the fourth conductive layer CL4. The second bonding pad 202 may further include a plurality of second via holes V2 as well. A portion of the second via holes V2 (e.g. the second via holes V2-1 in FIG. 4A) expose the third conductive layer CL3, and another portion of the second via holes V2 (e.g. the second via holes V2-2 in FIG. 4A) expose the fourth conductive layer CL4. In some embodiments, the materials of the third passivation layer PL3 and the fourth passivation layer PL4 may include the same materials or elements. In some embodiments, when viewing the substrate 101 from the normal direction, the third conductive layer CL3 is adjacent to the fourth conductive layer CL4. In direction X, there are no other third conductive layer CL3 or fourth conductive layer CL4 interposed between the third conductive layer CL3 and the fourth conductive layer CL4. In addition, the third conductive layer CL3 and the fourth conductive layer CL4. may partially overlap, or may not overlap.

In some embodiments, the third conductive layer CL3 is closer to the first bonding pad 201 than the fourth conductive layer CL4. In some embodiments, the third conductive layer CL3 is adjacent to the second conductive layer CL2, which means that when viewing the substrate 101 from the normal direction, there is no any conductive layer disposed between the third conductive layer CL3 and the second conductive layer CL2 in direction X.

In some embodiments, if there is a need to electrically connect the third conductive layer CL3 with the fourth conductive layer CL4, the second bonding pad 202 may further include a second connecting conductive layer TCL2 disposed on the fourth passivation layer PL4, and in the second via holes V2. That is, the second connecting conductive layer TCL2 is electrically connected to the third conductive layer CL3 and the fourth conductive layer CL4 through the second via holes V2.

Therefore, in some embodiments, the structure of the second bonding pad 202 is similar to that of the first bonding pad 201, so that the third conductive layer CL3, the third passivation layer PL3, the fourth conductive layer CL4, the second via hole V2, and in some embodiment, the second connecting conductive layer TCL2 of the second bonding pad 202 may correspond to the first conductive layer CL1, the first passivation layer PL1, the second conductive layer CL2, the first via hole V1, and in some embodiment, the first connecting conductive layer TCL1 of the first bonding pad 201, respectively. In some embodiments, the relationship between the elements in the first bonding pad 201 can also exist between the elements in the second bonding pad.

As shown in FIG. 4B, in some embodiments, the first conductive layer CL1 and the second conductive layer CL2 of the first bonding pad 201 have different distance from the substrate 101 in direction Z (i.e. along the normal direction of the substrate, the first conductive layer CL1 and the second conductive layer CL2 have different distance from the substrate 101). That is, the distance from the bottom surface of the first conductive layer CL1 to the substrate 101 in direction Z is different than the distance H2 from the bottom surface of the second conductive layer CL2 to the substrate 101 in direction Z. In some embodiments, the distance from the bottom surface of the first conductive layer CL1 to the substrate 101 in direction Z is shorter than the distance H2 from the bottom surface of the second conductive layer CL2 to the substrate 101 in direction Z. In some embodiments, the distance from the bottom surface of the first conductive layer CL1 to the substrate 101 in direction Z may be substantially equal to the distance H2 from the bottom surface of the second conductive layer CL2 to the substrate 101 in direction Z. In some embodiments, because the structure of the second bonding pad 202 is substantially the same as that of the first bonding pad 201, the distance from the bottom surface of the third conductive layer CL3 to the substrate 101 in direction Z is also different than the distance from the bottom surface of the fourth conductive layer CL4 to the substrate 101 in direction Z, for example, the distance between the bottom surface of the third conductive layer CL3 and the substrate 101 in direction Z is shorter than the distance between the bottom surface of the fourth conductive layer CL4 and the substrate 101 in direction Z. In some embodiments, the distance from the bottom surface of the third conductive layer CL3 to the substrate 101 in direction Z may be substantially equal to the distance from the bottom surface of the fourth conductive layer CL4 to the substrate 101 in direction Z. In some embodiments, "the distance between the bottom surface and the substrate 101" described in the present disclosure may indicate the shortest distance between the bottom surface and the surface of the substrate 101 in direction Z. In some embodiments, the first conductive layer CL1 or the third conductive layer CL3 may be in direct contact with the substrate, so that the shortest distance from the bottom surface of the first conductive layer CL1 or the third conductive layer CL3 to the substrate in direction Z may be 0.

As shown in FIG. 4B, in some embodiments, the distance from the bottom surface of the second conductive layer CL2 in the first bonding pad 201 to the substrate 101 may be different than the distance from the bottom surface of the third conductive layer CL3 in the second bonding pad 202 to the substrate 101. For example, as shown in FIG. 4B, the distance from the bottom surface of the second conductive layer CL2 to the substrate 101 is longer than the distance from the bottom surface of the third conductive layer CL3 to the substrate 101. In some other embodiments, the distance from the bottom surface of the second conductive layer CL2 to the substrate 101 may be longer than the distance from the top surface of the third conductive layer CL3 to the substrate 101.

Referring to FIG. 4A, in some embodiments, when viewing the substrate 101 from the normal direction, the first conductive layer CL1, the second conductive layer CL2, the third conductive layer CL3, and the fourth conductive layer CL4 are arranged in direction X in the aforementioned order. That is, when viewing the substrate 101 from the normal direction, the second conductive layer CL2 is between the first conductive layer CL1 and the third conductive layer CL3, and the third conductive layer CL3 is between the second conductive layer CL2 and the fourth conductive layer CL4.

As shown in FIG. 4B, according to some embodiments, the first bonding pad 201 includes the first conductive layer CL1 and the second conductive layer CL2, wherein the distance from the first conductive layer CL1 to the substrate 101 in direction Z may be different or the same as the distance from the second conductive layer CL2 to the substrate 101 in direction Z, and the second conductive layer CL2 is interposed between the first conductive layer CL1 and the third conductive layer CL3, and wherein the distance between the bottom surface of the second conductive layer CL2 and the substrate 101 is different than the distance between the bottom surface of the adjacent third conductive layer CL3 and the substrate 101. Thus, even if the first conductive layer CL1 and the third conductive layer CL3 are very close to each other in direction X (e.g. the distance between two adjacent sides of the bonding pads<5 μm), the first passivation layer PL1 or the second conductive layer CL2 is interposed between the first conductive layer CL1 and the third conductive layer CL3 in direction X, and the distance from the bottom surface of the second conductive layer CL2 to the substrate 101 is different than the distance from the bottom surface of the third conductive layer CL3 to the substrate 101. Thus, in some embodiments, when the first conductive layer CL1, the third conductive layer CL3, the second conductive layer CL2, and the third conductive layer CL3 all receive a signal source at the same time, electron transfer between the first conductive layer CL1 and the third conductive layer CL3 or the second conductive layer CL2 and the third conductive layer CL3 is difficult, which leads to a great improvement in the reliability of the signal.

As shown in FIG. 4A, in some embodiments, each conductive layer of bonding pads may be electrically connected to the wires 105 (e.g. wire 105-1, wire 105-2) on the substrate 101 according to actual needs. The number, pitch, shape, and size of the via holes of each of the bonding pads can be adjusted appropriately according to actual needs, as long as the first conductive layer CL1, the second conductive layer CL2 and the third conductive layer CL3 have the aforementioned positional relationship. The arrangement of the via holes illustrated in FIG. 4A is only for an example, but not limited thereto. For example, in the embodiment as shown in FIG. 4A, the first via holes V1 of the first bonding pad 201 may be arranged alternatively, which means that the first via holes V1 arranged in direction Y in the left side of the first bonding pad 201 (e.g. the first via holes V1-1) may be viewed as a first line, and the first via holes V1 arranged in direction Y in the right side of the first bonding pad 201 (e.g. the first via holes V1-2) may be viewed as a second line, wherein one of the first via hole V1 lines may be shifted along direction Y, so that one line of the first via holes V1 (e.g. the first via holes V1-2) may be disposed between another line of the first via holes V1 (e.g. the first via holes V1-1) in direction Y respectively.

As per the embodiments of FIGS. 4A and 4B, when viewing the substrate 101 from the normal direction, the first conductive layer CL1 and the second conductive layer CL2 of the first bonding pad 201 does not overlap each other; and when viewing the substrate 101 from the normal direction, the third conductive layer CL3 and the fourth conductive layer CL4 of the second bonding pad 202 does not overlap each other. That is, the orthographic projection of the second conductive layer CL2 on the substrate 101 does not overlap the orthographic projection of the first conductive layer CL1 on the substrate 101; the orthographic projection of the fourth conductive layer CL4 on the substrate 101 does not overlap the orthographic projection of the third conductive layer CL3 on the substrate 101. The expression "orthographic projection" set forth in the present disclosure indicates the projection of an object on the substrate along the normal direction (direction Z) of the substrate.

As mentioned above, in the embodiment of FIG. 4A, when viewing the substrate 101 from the normal direction, because a boundary DL1 between the first conductive layer CL1 and the second conductive layer CL2 (i.e. one side of the first conductive layer CL1 and one side of the second conductive layer CL2 overlaps each other, as shown by the dotted line in the middle of the bonding pad 201 in FIG. 4A, or the dotted line between bonding pad 201 in FIG. 4B), the distance between the first conductive layer CL1 and the second conductive layer CL2 in direction X is zero. In some embodiments, the distance between the first conductive layer CL1 and the second conductive layer CL2 in direction X may be greater than zero.

Figure 4C:
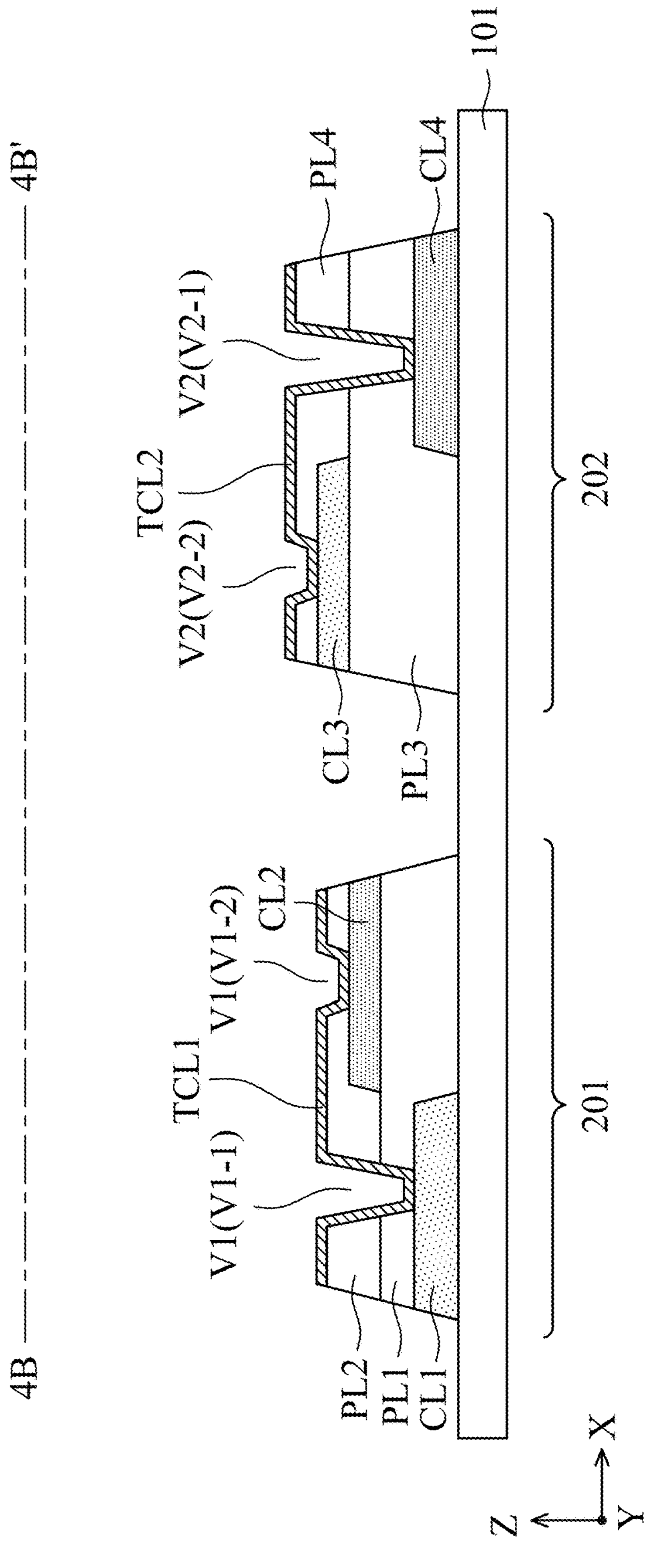
FIG. 4C is a schematic cross-sectional view taken along line 4B-4B' in FIG. 4A according to some other embodiments of the present disclosure.

In some other embodiments, a schematic cross-sectional view of the bonding pad structure taken along line 4B-4B' of FIG. 4A may be shown as FIG. 4C. The schematic cross-sectional view of FIG. 4C is substantially the same as that of FIG. 4B, except that in the second bonding pad 202, the distance from the bottom surface of the third conductive layer CL3 to the substrate 101 is greater than the distance from the bottom surface of the fourth conductive layer CL4 to the substrate 101 and the distance from the bottom surface of the second conductive layer CL2 to the substrate 101. At this time, the fourth conductive layer CL4 may be in direct contact with the substrate 101, or other insulation layer may be presented between the fourth conductive layer CL4 and the substrate 101, the third passivation layer PL3 may be disposed on the fourth conductive layer CL4. The third conductive layer CL3 may be disposed on the third passivation layer PL3, and the fourth passivation layer PL4 may be disposed on the third conductive layer CL3 and the third passivation layer PL3.

In some embodiments, the distance from the bottom surface of the third conductive layer CL3 to the substrate 101 may be different than the distance from the bottom surface of the second conductive layer CL2 to the substrate 101. For example, as per the embodiments of FIG. 4C, by making the maximum thickness of the first passivation layer PL1 along direction Z less than the maximum thickness of the third passivation layer PL3 along direction Z, the distance from the bottom surface of the third conductive layer CL3 to the substrate 101 may be different than the distance from the bottom surface of the second conductive layer CL2 to the substrate 101. In some embodiments, the distance from the bottom surface of the third conductive layer CL3 to the substrate 101 may be greater than the distance from the top surface of the second conductive layer CL2 to the substrate 101.

As shown in FIG. 4B, in some embodiments, the first passivation layer PL1 may directly connect with the third passivation layer PL3, and the second passivation layer PL2 may directly connect with the fourth passivation layer PL4. Therefore, in some embodiments, the third passivation layer PL3 may be regarded as the first passivation layer PL1, the fourth passivation layer PL4 may be viewed as the second passivation layer PL2. At this time, the first conductive layer CL1 and the third conductive layer CL3 are disposed under the first passivation layer PL1; and in direction X, the second conductive layer CL2 between the first passivation layer PL1 and the second passivation layer is interposed between the first conductive layer CL1 and the third conductive layer CL3.

Figure 5A:
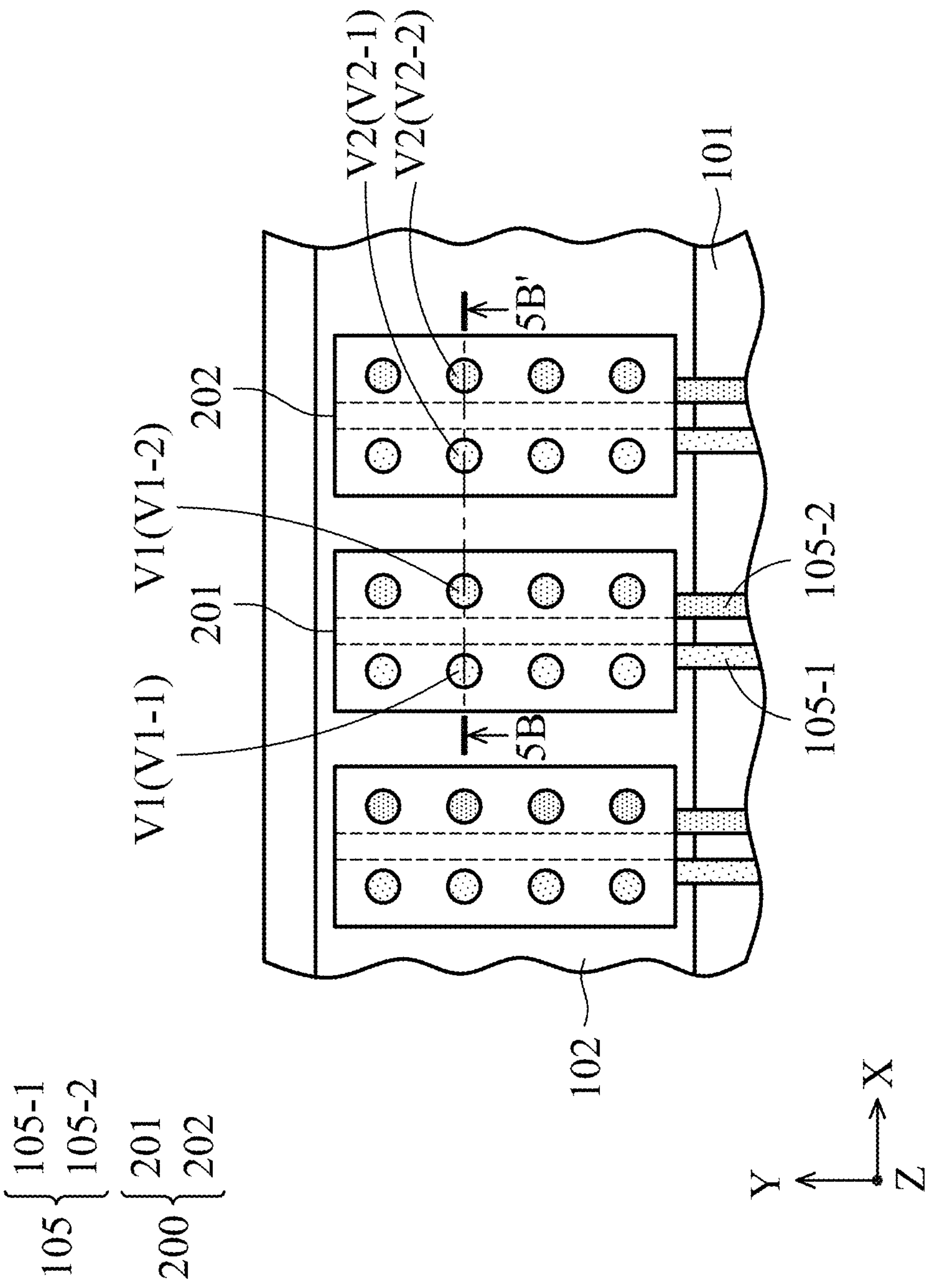
FIG. 5A is a schematic top view of a bonding pad structure, according to some embodiments of the present disclosure.
Figure 5B:
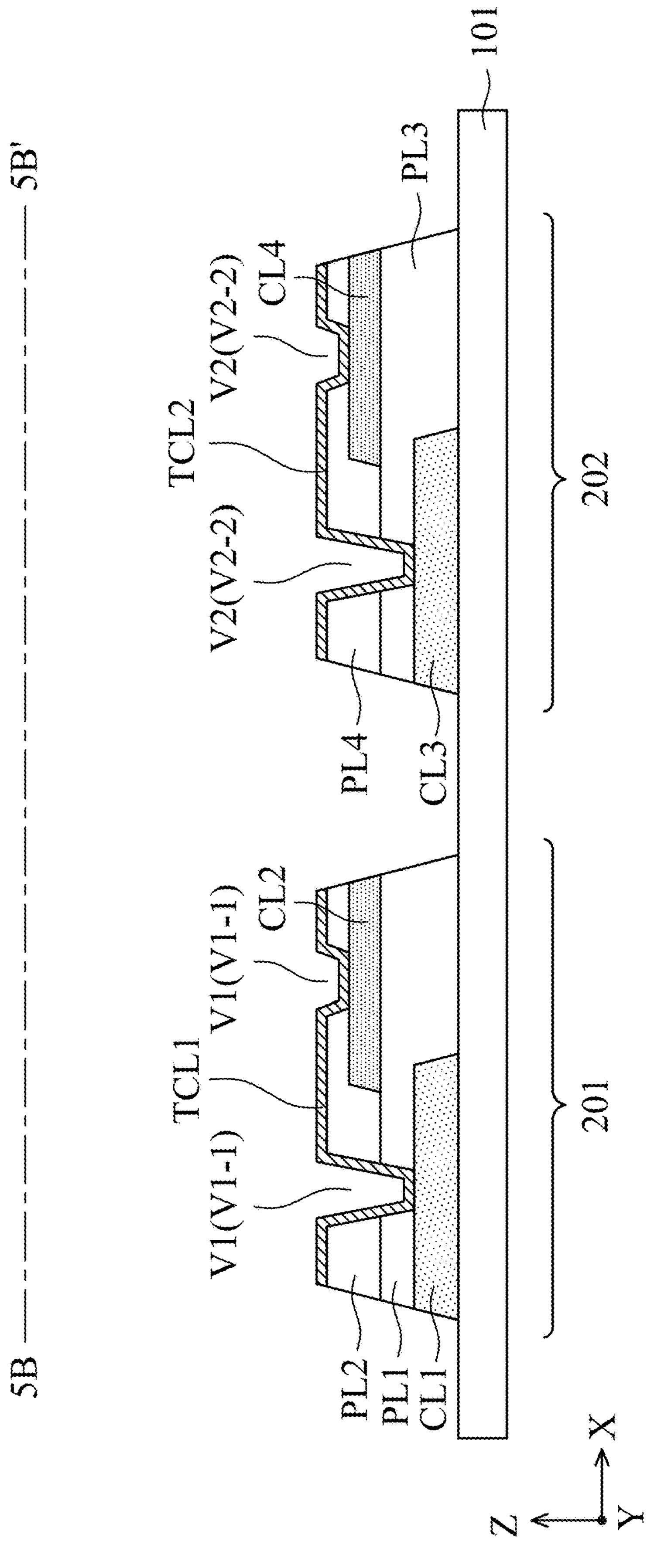
FIG. 5B is a schematic cross-sectional view taken along line 5B-5B' in FIG. 5A.

Referring to FIGS. 5A and 5B, FIG. 5A is a schematic top view of a bonding pad structure, according to some embodiments of the present disclosure, and FIG. 5B is a schematic cross-sectional view taken along line 5B-5B' in FIG. 5A. The bonding pad structure of FIG. 5B is similar to the bonding pad structure of FIG. 4B, except that in FIG. 5B, the orthographic projection of the second conductive layer CL2 on the substrate 101 and the orthographic projection of the first conductive layer CL1 on the substrate 101 partially overlap, and the orthographic projection of the fourth conductive layer CL4 on the substrate 101 and the orthographic projection of the third conductive layer CL3 on the substrate 101 partially overlap. That is, as shown in FIG. 5B, when viewing the substrate 101 from the normal direction, the first conductive layer CL1 and the second conductive layer CL2 partially overlap, and the third conductive layer CL3 and the fourth conductive layer CL4 partially overlap.

Therefore, in the embodiments of FIGS. 5A and 5B, when viewing the substrate 101 from the normal direction, at least part of the second conductive layer CL2 is still between the first conductive layer CL1 and the third conductive layer CL3, and at least part of the third conductive layer CL3 is still between the second conductive layer CL2 and the fourth conductive layer CL4. That is, at least part of the orthographic projection of the second conductive layer CL2 on the substrate 101 still does not overlap the orthographic projection of the first conductive layer CL1 on the substrate 101, and at least part of the orthographic projection of the fourth conductive layer CL4 on the substrate 101 still does not overlap the orthographic projection of the third conductive layer CL3 on the substrate 101.

Because at least part of the second conductive layer CL2 is still between the first conductive layer CL1 and the third conductive layer CL3, even when the first bonding pad 201 approaches to the second bonding pad 202, there is still a separation distance between the first conductive layer CL1 of the first bonding pad 201 and the third conductive layer CL3 of the second bonding pad 202 in direction X, which may reduce the probability of electron transfer between the two conductive layers.

Each layer of the bonding pad structure of the present disclosure may be formed by one or more deposition processes, lithography processes, and etching processes. For example, in some embodiments, the deposition processes may include a chemical vapor deposition process (such as plasma enhanced chemical vapor deposition (PECVD)), a physical vapor deposition process (such as a sputtering process, or an evaporation process), another suitable process, or a combination thereof, but it is not limited thereto. In addition, in some embodiments, the aforementioned lithography processes may include processes such as photoresist coating, mask alignment, exposure, photoresist development, cleaning and drying, etc. In some embodiments, the aforementioned etching processes may be a dry etching process, a wet etching process, or another suitable etching process. Each via hole of the bonding pad structure may also formed by lithography and etching processes.

The materials used for each conductive layer of the present disclosure (the first conductive layer CL1 to the fourth conductive layer CL4, and the first connecting conductive layer TCL1 and the second connecting conductive layer TCL2) are not particularly limited, as long as the materials are conductive. For example, it may be formed of metal conductive materials, conductive metal oxides, or a combination thereof. In some embodiments, the metal conductive materials may include copper, silver, tin, aluminum, molybdenum, tungsten, gold, chromium, nickel, platinum, copper alloy, silver alloy, tin alloy, aluminum alloy, molybdenum alloy, tungsten alloy, gold alloy, chromium alloy, nickel alloys, platinum alloys, other suitable conductive materials, or a combination thereof, but not limited thereto. the aforementioned conductive metal oxides may include but not limited to ruthenium oxide, indium zinc oxide, indium gallium zinc oxide (IGZO), indium tin oxide (ITO), indium tin zinc oxide (ITZO), antimony tin oxide (ATO), aluminum zinc oxide (AZO), aluminum zinc oxide, zinc oxide, and indium tin oxide. In some embodiments, the conductive layer can be made of a material with visible light transmittance, such as the aforementioned conductive metal oxide.

The materials used for each passivation layer of the present disclosure are also not particularly limited, as long as the purpose of electrically isolating the upper and lower layers in direct contact with it can be achieved. The materials of each passivation layer may include, for example, silicon oxide, silicon nitride, silicon oxynitride, metal oxide, metal nitride, metal silicide, transition metal oxide, transition metal nitride, transition metal silicide, nitrogen oxides of metals, any other suitable material, or a combination thereof, but not limited thereto. The materials for different passivation layers may be the same or different.

The thickness of each layer in the bonding pad structure of the present disclosure is not particularly limited, and can be adjusted according to actual needs. In some embodiments, the thicknesses of the first conductive layer CL1, the second conductive layer CL2, the third conductive layer CL3, and the fourth conductive layer CL4 may be independently from 0.5 μm to 2 μm, or from 0.6 μm to 1.5 μm. The thicknesses of the first connecting conductive layer TCL1 and the second connecting conductive layer TCL2 may be independently from 0.5 μm to 1.5 μm, or from 0.04 μm to 0.07 μm. In some embodiments, the distance $D_g$ between the first bonding pad 201 and the second bonding pad 202, e.g. as shown in FIG. 4A, may be from 5 μm to 50 μm, or from 10 μm to 30 μm.

Figure 6B:
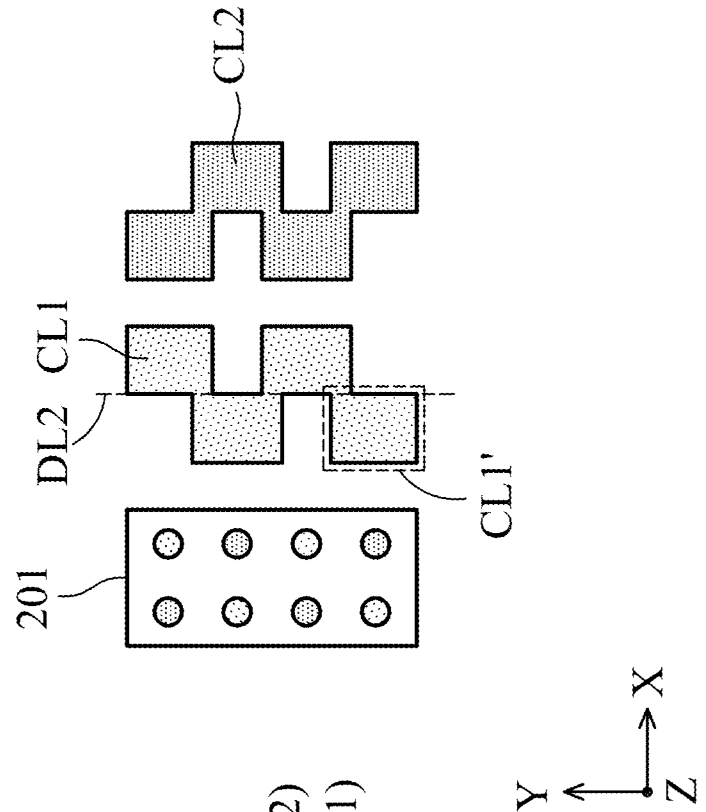
FIGS. 6B-6E are structure schematic illustrations of the bonding pad structure illustrated in FIG. 6A.
Figure 6A:
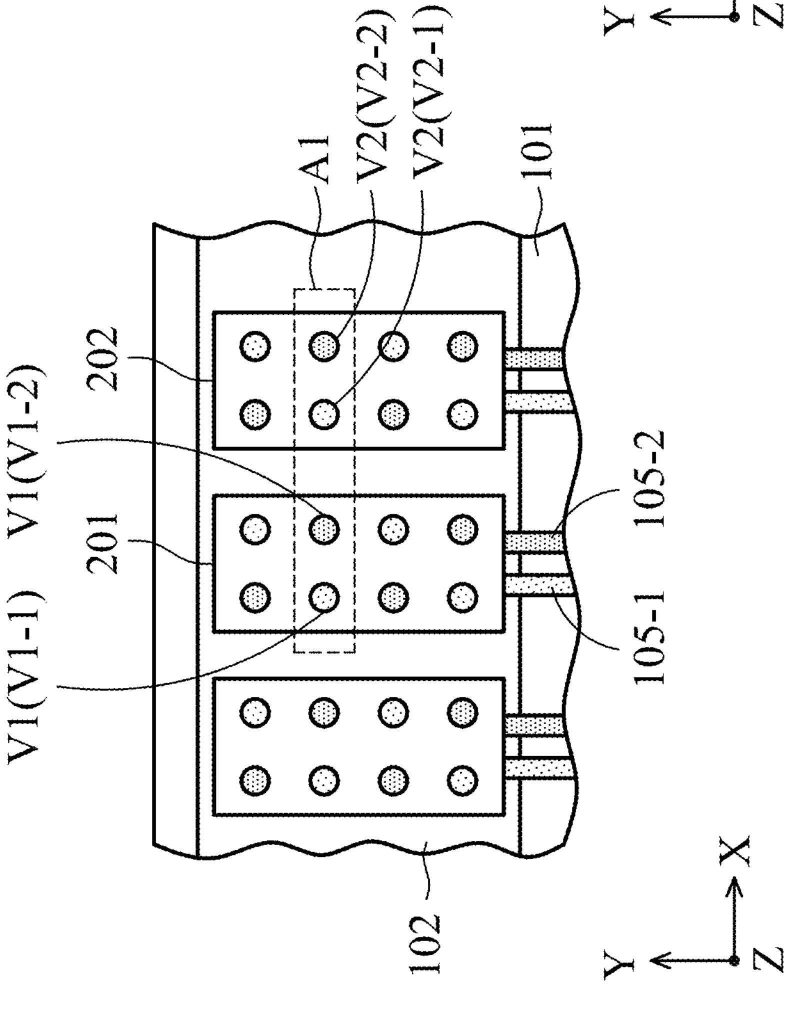
FIG. 6A is a schematic top view of the bonding pad structure, according to some other embodiments of the present disclosure.

Referring to FIG. 6A, it is a schematic top view of the bonding pad structure, according to some other embodiments of the present disclosure. In these embodiments, two adjacent via holes expose different conductive layers. In some embodiments, as shown in FIG. 6A, the via holes arranged up to down in direction Y at the left side of the first bonding pad 201 expose the second conductive layer CL2, the first conductive layer CL1, the second conductive layer CL2, and the first conductive layer CL1 respectively, i.e. the second conductive layer CL2 and the first conductive layer CL1 are arranged alternatively. The via holes arranged up to down in direction Y at the right side of the first bonding pad 201 expose the first conductive layer CL1, the second conductive layer CL2, the first conductive layer CL1, and the second conductive layer CL2 respectively, i.e. the first conductive layer CL1 and the second conductive layer CL2 are arranged alternatively. The case is similar in the second bonding pad 202. That is, two adjacent via holes in the first bonding pad 201 expose the first metal layer CL1 and the second metal layer CL2 respectively; two adjacent via holes in the second bonding pad 202 expose the third metal layer CL3 and the fourth metal layer respectively.

In the embodiments of FIG. 6A, the aforementioned spatial relative relationships between the bonding pads are the same as those described above. For example, in FIG. 6A, four via holes arranged along direction X in region A1 expose the first conductive layer CL1, the second conductive layer CL2, the third conductive layer CL3, and the fourth conductive layer CL4 from left to right. It also means that, when viewing the substrate 101 from the normal direction, at least part of the second conductive layer CL2 is still between the first conductive layer CL1 and the third conductive layer CL3, and at least part of the third conductive layer CL3 is still between the second conductive layer CL2 and the fourth conductive layer CL4.

With the arrangement of the bonding pad structures shown in FIG. 6A, because the conductive layers exposed by the adjacent via holes are located on different layers, serious electron transfer may not occur in adjacent conductive layers (when viewing the substrate 101 from the normal direction), even if the via holes (located in the adjacent bonding pads) are arranged close to each other. Therefore, there is more freedom in the arrangement of the via holes in the bonding pads.

In order to explain the structures and the location relationships of the conductive layers in the embodiment in FIG. 6A more clearly, FIG. 6A will be further explained with FIGS. 6B-6E below. It should be understood that, for the convenience of explanation, in the embodiments of FIGS. 6A-6E, the second bonding pad 202 has the same structure as the first bonding pad 201 has, and thus, the location of the third conductive layer CL3 in the second bonding pad 202 may correspond to the location of the first conductive layer CL1 in the first bonding pad 201; the location of the fourth conductive layer CL4 in the second bonding pad 202 may correspond to the location of the second conductive layer CL2 in the first bonding pad 201.

In FIG. 6A, when viewing the substrate 101 from the normal direction, the boundary dotted line between the first conductive layer CL1 and the second conductive layer CL2 and the boundary dotted line between the third conductive layer CL3 and the fourth conductive layer CL4 illustrated in FIGS. 4A and 5A are omitted for concise. In order to clearly show the boundaries and shapes of the conductive layers in the bonding pad, the conductive layers at different heights of the bonding pad 201 are first shown in FIG. 6B. In FIG. 6B, the left side is a top view of the bonding pad 201, the middle is only the first conductive layer CL1 in the bonding pad 201, and the right illustrates the second conductive layer CL2 only. That is, the first conductive layer CL1 and the second conductive layer CL2 in the first bonding pad 201 can be directly observed in FIG. 6B.

As mentioned above, in the embodiment of FIG. 6C, the second bonding pad 202 has the same structure as the first bonding pad 201 has, and thus, the shape of the third conductive layer CL3 in the second bonding pad 202 illustrated in FIG. 6C is substantially the same as that of the first conductive layer CL1 in the first bonding pad 201.

From FIG. 6B, it may be understood that when viewing the substrate 101 from the normal direction, the different conductive layers in each bonding pad may have edges with a wavy shape respectively, and the wavy edges may partially overlap each other, and part of the first conductive layer CL1 is at the right side of the second conductive layer CL2, part of the first conductive layer CL1 is at the left side of the second conductive layer CL2; part of the third conductive layer CL3 is at the right side of the fourth conductive layer CL4, part of the third conductive layer CL3 is at the left side of the fourth conductive layer CL4. That is, at least part of the orthographic projection of the second conductive layer CL2 on the substrate 101 still does not overlap the orthographic projection of the first conductive layer CL1 on the substrate 101, at least part of the orthographic projection of the fourth conductive layer CL4 on the substrate 101 still does not overlap the orthographic projection of the third conductive layer CL3 on the substrate 101. In some embodiments, when viewing the substrate 101 from the normal direction, the different conductive layers in each bonding pad may have wavy patterns. Referring to FIG. 6B, the term “wavy pattern” of the present disclosure may indicate that, for example, the first sub conductive layers CL1' are alternatively arranged at two sides of a dummy line section DL2.

Figure 6D:
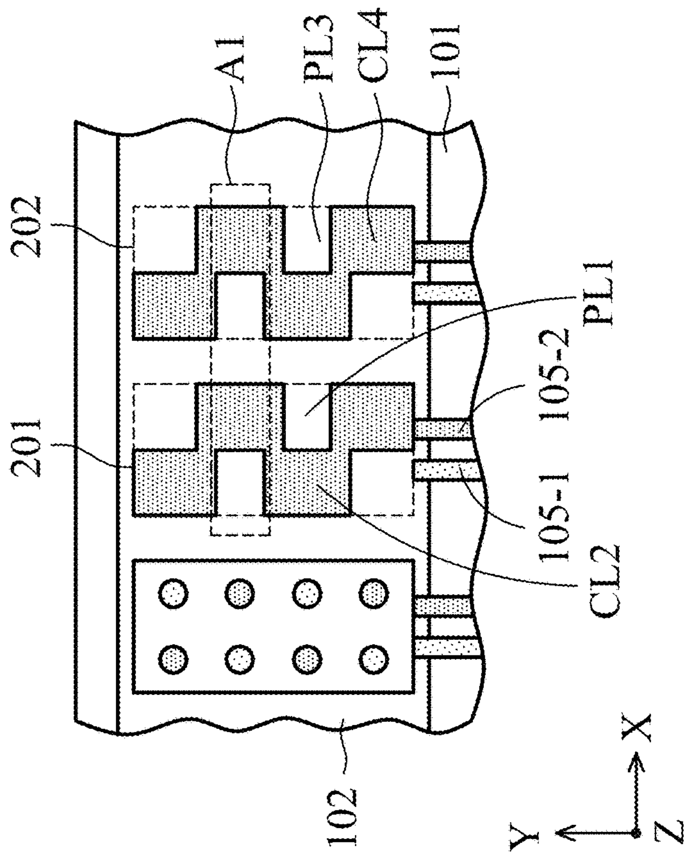
Figure 6C:
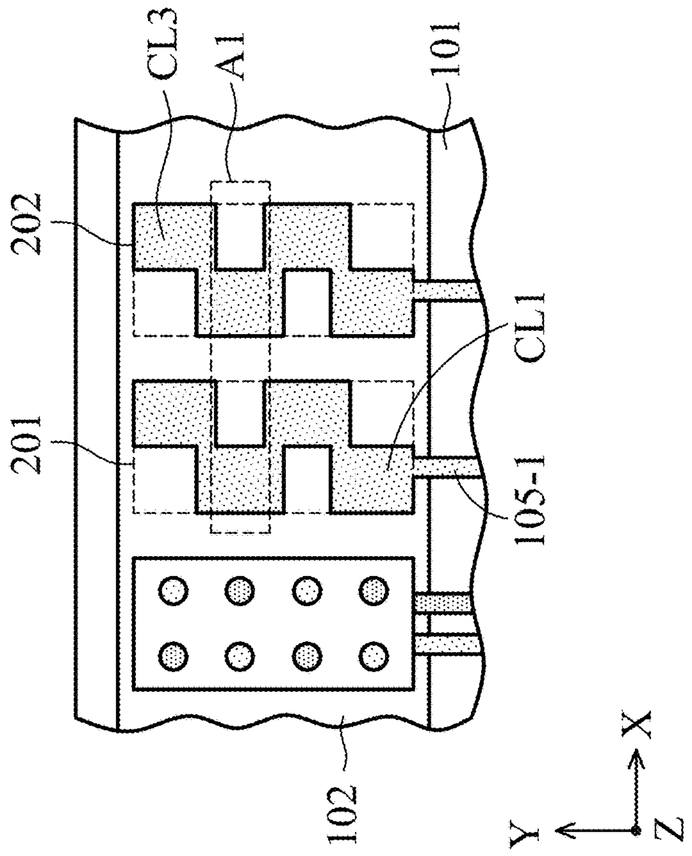

FIGS. 6C and 6D are explanatory diagrams of conductive layers, both of which are lower layers or upper layers, of the first bonding pad 201 and the second bonding pad 202 in FIG. 6A, respectively. In FIG. 6C, only illustrates the first conductive layer CL1 of the first bonding pad 201 and the third conductive layer CL3 of the second bonding pad 202. In region A1, it is clear that there is still a distance between the first conductive layer CL1 and the third conductive layer CL3 in direction X, and a passivation layer (such as the first passivation layer PL1 (not shown) in the first bonding pad 201) is between the first conductive layer CL1 and the third conductive layer CL3. In addition, in some embodiments, the distance between the bottom surface of the first conductive layer CL1 and the substrate 101 is different than the distance between the bottom surface of the third conductive layer CL3 and the substrate 101.

In FIG. 6D, the second conductive layer CL2 of the first bonding pad 201 and the fourth conductive layer CL4 of the second bonding pad 202 are illustrated. In region A1, it is clear that there is still a distance between part of the second conductive layer CL2 and the fourth conductive layer CL4 in direction X, and a passivation layer (such as the fourth passivation layer PL4 (not shown) in the second bonding pad 202) is between the second conductive layer CL2 and the fourth conductive layer CL4.

Figure 6E:
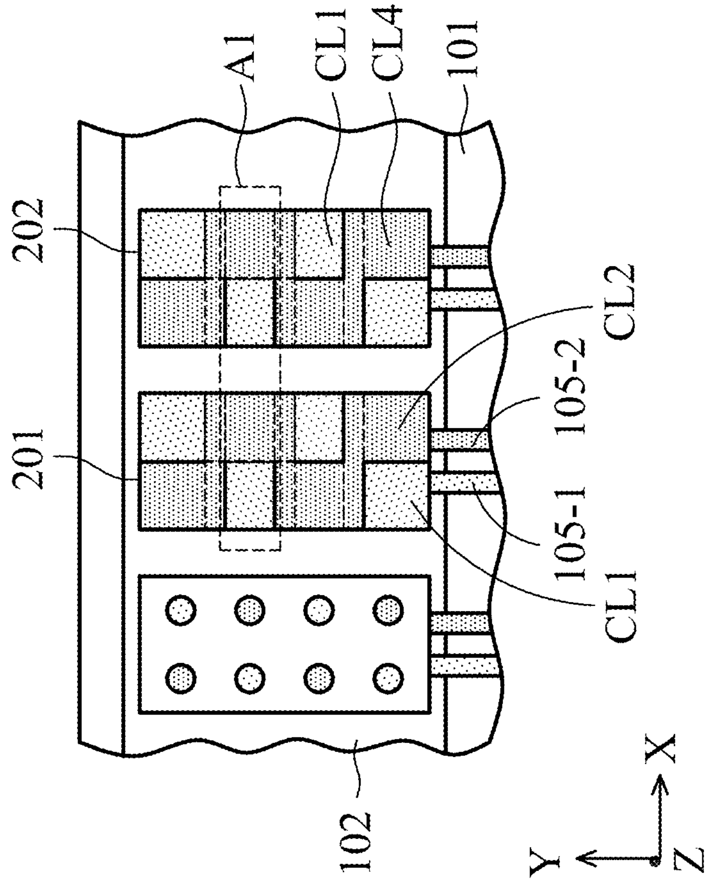

In FIG. 6E, the first conductive layer CL1 and the second conductive layer CL2 of the first bonding pad 201 and the third conductive layer CL3 and the fourth conductive layer CL4 of the second bonding pad 202 are illustrated. In FIG. 6E, it can be understood that, in the embodiment, when viewing the substrate 101 from the normal direction, at least part of the second conductive layer CL2 is between the first conductive layer CL1 and the third conductive layer CL3 or at least part of the third conductive layer CL3 is still between the second conductive layer CL2 and the fourth conductive layer CL4 (e.g. in region A1).

In order to expose different conductive layers by two adjacent via holes, and keep the aforementioned spatial relative relationships between the bonding pads, in some embodiments, when viewing the substrate 101 from the normal direction, the edge of the first conductive layer CL1 of the first bonding pad 201 and the edge of the third conductive layer CL3 of the second bonding pad 202 have wavy shapes, and the shape of the edge of the second conductive layer CL2 is a mirror image of the wavy edges of the first conductive layer CL1, the shape of the edge of the fourth conductive layer is a mirror image of the wavy edges of the third conductive layer (partially symmetric with a symmetry axis parallel to direction Y). With this shape, when viewing the substrate 101 from the normal direction, among the first conductive layer CL1 and the second conductive layer CL2, part of the first conductive layer CL1 is at one side of the second conductive layer CL2, and the other part of the first conductive layer CL1 is at another side of the second conductive layer CL2 (e.g. as shown in FIG. 6E).

Referring to FIG. 6B, in some embodiments, each of the wavy patterns of conductive layers may be regarded as formed by a plurality of sub-conductive layers. For example, taking the first conductive layer CL1 in the middle of FIG. 6B as an example, the first conductive layer CL1 may be regarded as including a plurality of first sub conductive layers CL1'. The first sub conductive layers CL1' are alternately arranged with respect to the dummy line section DL2 in the first bonding pad 201, and part of the closest two first sub conductive layers CL1' are in direct contact with each other (i.e. in the bonding pad 201, each the first sub conductive layer CL1' has at least two sides which do not contact with the other first sub conductive layer CL1').

Figure 7:
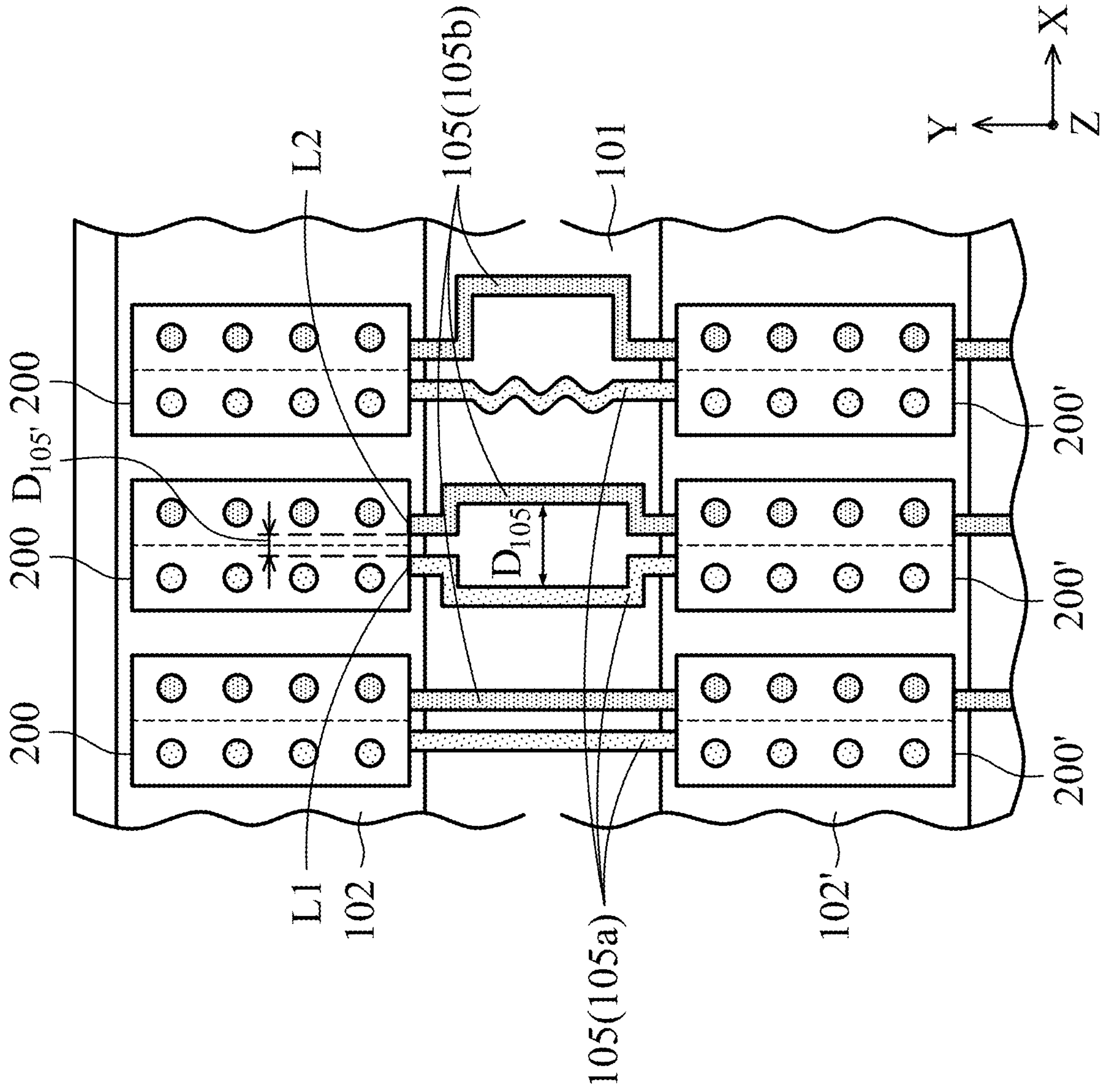
FIG. 7 is a schematic view of various manners of connecting bonding pad structures, according to some embodiments of the present disclosure.

Referring to FIG. 7, it is a schematic top view of manners of connecting bonding pad structures, according to some embodiments of the present disclosure. There are three manners of connection presented in FIG. 7, and the manners of connection presented in FIG. 7 are examples, and the arrangement of the bonding pads is not limited thereto. In some embodiments, in addition to the bonding pad disposing region 102, there may be other bonding pad disposing regions on the substrate 101, e.g. the bonding pad disposing region 102' in FIG. 7. The bonding pads in the different bonding pad disposing regions (e.g. bonding pad 200 and bonding pad 200') may be electrically connected to each other by the wires 105 between the bonding pads. For example, the bonding pad disposing region 102 may be an outer lead bonding region (OLB region), the bonding pad disposing region 102' may be a chip-on-glass region (COG region), the bonding pad 200 and bonding pad 200' in two bonding pad disposing regions may have the same structure, and each conductive layer of the different bonding pads (e.g. between the conductive layers at the same vertical height) may be electrically connected to each other by the wires 105.

In some embodiments, as shown in FIG. 7, after connecting the bonding pad 200 to the bonding pad 200', only one of the conductive layers of bonding pad 200' may be selected to continue to extend the wire. For example, after connecting to the chip-on-glass region, only one conductive layer (e.g. the right conductive layer of the bonding pad 200' in the bonding pad disposing region 102') continue to extend the wire. For example, the wire extended from the bonding pad 200' may be electrically connected to the data line of the display device, and extended into the display region of the display device. However, this is only an example, and the appropriate connection relationship and wire between the bonding pads can be selected according to actual needs, but not limited thereto.

The connection manner will be described in detail based on FIG. 7. First, Referring to the leftmost aspect of FIG. 7, in some embodiments, the bonding pads 200 and 200' in the bonding pad disposing regions 102 and 102' have the structures as shown in FIG. 4B, and the bonding pads 200 and 200' are set with the same orientation. That is, both of the bonding pad 200 and the bonding pad 200' have the first conductive layer CL1 (left) and the second conductive layer CL2 (right). In some embodiments, the first conductive layer CL1 in the bonding pad 200 and the first conductive layer CL1 in the bonding pad 200' may be electrically connected to each other by the wire 105*a* formed on the substrate 101; the second conductive layer CL2 of the bonding pad 200 and the second conductive layer CL2 of the bonding pad 200' may be electrically connected to each other by another wire 105*b* formed on the substrate 101.

Referring to the middle aspect of FIG. 7, in some embodiments, when viewing the substrate 101 from the normal direction, there may be a distance $D_{105}$ between at least part of the wire 105*a* and wire 105*b* which connect bonding pad 200 and bonding pad 200', and when viewing the substrate 101 from the normal direction, the distance $D_{105}$ is longer than the distance between the first conductive layer CL1 and the second conductive layer CL2 in bonding pad 200 in direction X (e.g. the distance between the rightmost side of the first conductive layer CL1 and the leftmost side of the second conductive layer CL2 in FIG. 4B in direction X). In the embodiment of FIG. 7, the shortest distance between the first conductive layer CL1 and the second conductive layer CL2 of the bonding pad 200 in direction X is zero, and when the structure of the bonding pad 200 is as shown in FIG. 5B, that is, when viewing the substrate 101 from the normal direction, the first conductive layer CL1 partially overlaps the second conductive layer CL2, and the distance between the first conductive layer CL1 and the second conductive layer CL2 is also regarded as zero. The signal interference between wires can be further reduced by enlarging the distance between the wire 105*a* and the wire 105*b*. In some embodiments, the distance $D_{105}$ may be longer than the distance (e.g. $D_{105}'$ in FIG. 7) between adjacent sides of two adjacent wires near the boundary (L1, L2) between the wire 105 and bonding pad 200 (e.g. the rightmost side of the wire 105*a* near the boundary L1 between the bonding pad 200 and the leftmost side of the wire 105*b* near the boundary L2 between the bonding pad 200 and the wire 105*b*) in direction X.

Referring to the rightmost aspect of FIG. 7, in this embodiment, two of the first conductive layers CL1 are still electrically connected to each other by wire 105*a*; two of the second conductive layers CL2 are still electrically connected to each other by wire 105*b*. When there is not enough space for extending the wires on one side, for example, due to the limited wiring space on the substrate 101, the wires on the one side may have a tortuous path to keep the length of wire 105*a* similar as the length of the wire 105*b*, so that to prevent a large voltage drop between the two wires due to the large difference in the lengths of the wires. Therefore, the conductive layers in the bonding pad 200' may receive a signal of similar voltages.

As mentioned above, according to the bonding pad structures disclosed in the embodiments of the present disclosure, when viewing the substrate where the bonding pad structure on from the normal direction, in the adjacent bonding pads, the adjacent conductive layers have different distances between the substrate in direction Z. Thus, the electron transfer between conductive layers will be reduced when the bonding pads are very close to each other. The other embodiments disclosed in the present disclosure also provides the bonding pad connect manners in different bonding pad disposing regions. According to some embodiment, by the bonding pad structure and the manner of connection mentioned above, the arrangement of the bonding pads in the electronic device will be closer, or the area efficiency of the substrate will be improved.

Although embodiments of the present disclosure and advantages thereof have been described above, it should be understood that various changes, substitutions and alterations can be made by those of ordinary skill in the art without departing from the spirit and scope of the disclosure. In addition, the scope of the claims of the present disclosure is not limited to the process, machine, manufacturing, material composition, device, method and steps described in the specific embodiments set forth in the specification, the presently existing or later to be developed process, machine, manufacturing, material composition, device, method and steps which may be readily appreciated from the present disclosure by one of ordinary skill in the art may be utilized according to the present disclosure, as long as what is substantially the same function can be performed or substantially the same result can be achieved in the embodiments described herein. Accordingly, the scope of the claims of the present disclosure includes the process, machine, manufacturing, material composition, device, method and steps mentioned above. In addition, it can be understood that, with the various implementations listed above, the present disclosure includes various implements. Each claim may constitute an individual embodiment, and the scope of the claims of the present disclosure also includes the combinations of the claims and embodiments. The scope of the present disclosure is subject to the definition of the scope of the appended claims.

What is claimed is:

1. An electronic device, comprising:

a substrate comprising a peripheral region;

a first conductive structure disposed in the peripheral region and comprising a first conductive layer and a second conductive layer, wherein the first conductive layer and the second conductive layer are arranged along a first direction;

a second conductive structure disposed in the peripheral region and comprising a third conductive layer, wherein the first conductive structure and the second conductive structure are arranged along a second direction perpendicular to the first direction;

a first wire disposed in the peripheral region and electrically connected between the first conductive layer and the third conductive layer; and a second wire disposed in the peripheral region and electrically connected to the second conductive layer, wherein the first wire is adjacent to the second wire along the first direction, wherein the substrate comprises a surface, and a minimum distance between the first conductive layer and the surface of the substrate is different from a minimum distance between the second conductive layer and the surface of the substrate.

2. The electronic device as claimed in claim 1, further comprising a third conductive structure disposed in the peripheral region, wherein the first conductive structure and the third conductive structure are arranged along the first direction.

3. The electronic device as claimed in claim 2, further comprising a fourth conductive structure disposed in the peripheral region, wherein the third conductive structure and the fourth conductive structure are arranged along the second direction.

4. The electronic device as claimed in claim 3, wherein the third conductive structure comprises a fourth conductive layer and a fifth conductive layer.

5. The electronic device as claimed in claim 4, further comprising a third wire electrically connected to the fourth conductive layer and a fourth wire electrically connected to the fifth conductive layer, wherein the third wire is adjacent to the fourth wire along the first direction.

6. The electronic device as claimed in claim 5, wherein the third wire electrically connects to the fourth conductive structure.

7. The electronic device as claimed in claim 1, wherein the second wire electrically connects to the second conductive structure.

8. The electronic device as claimed in claim 1, wherein the first wire comprises a plurality of turning portions.

9. The electronic device as claimed in claim 1, wherein the second wire comprises a plurality of turning portions.

* * * * *